(12) United States Patent
Wyatt

(10) Patent No.: US 7,504,879 B2
(45) Date of Patent: Mar. 17, 2009

(54) TRANSCONDUCTOR AND FILTER CIRCUIT

(75) Inventor: Michael Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 149 days.

(21) Appl. No.: 11/510,443

(22) Filed: Aug. 24, 2006

(65) Prior Publication Data

US 2008/0122530 A1    May 29, 2008

(51) Int. Cl.
     *G05F 1/00* (2006.01)
(52) U.S. Cl. .................................. 327/552; 327/558
(58) Field of Classification Search .................. 327/280
     See application file for complete search history.

(56) References Cited

U.S. PATENT DOCUMENTS

| | | |
|---|---|---|
| 3,746,984 A | 7/1973 | Cerveny |
| 3,829,774 A | 8/1974 | Cerveny |
| 4,647,875 A | 3/1987 | Argintaru et al. |
| 4,810,960 A | 3/1989 | Owen et al. |
| 5,448,595 A | 9/1995 | Kaku et al. |
| 5,489,873 A * | 2/1996 | Kamata et al. .............. 327/558 |
| 5,606,731 A | 2/1997 | Pace et al. |
| 5,623,744 A | 4/1997 | Triplett et al. |
| 5,825,809 A | 10/1998 | Sim |
| 5,901,347 A | 5/1999 | Chambers et al. |
| 5,949,820 A | 9/1999 | Shih et al. |
| 6,011,431 A | 1/2000 | Gilbert |
| 6,014,554 A | 1/2000 | Smith |
| 6,064,277 A | 5/2000 | Gilbert |
| 6,111,911 A | 8/2000 | Sanderford, Jr. et al. |
| 6,138,190 A | 10/2000 | Nordling |
| 6,262,623 B1 | 7/2001 | Molnar |
| 6,317,016 B1 | 11/2001 | Kuo |
| 6,407,658 B2 | 6/2002 | Kuo |
| 6,433,626 B1 | 8/2002 | Guimaraes |
| 6,466,566 B1 | 10/2002 | De Gaudenzi et al. |
| 6,476,676 B1 | 11/2002 | Tanaka et al. |
| 6,525,601 B2 | 2/2003 | Gilbert |
| 6,674,275 B2 | 1/2004 | Darzy |

(Continued)

FOREIGN PATENT DOCUMENTS

EP    0 185 416 B1    2/1992

(Continued)

OTHER PUBLICATIONS

Van der Spiegel, Jan, "PSPICE A Brief Primer," <http://www.seas.upenn.edu/~jan/spice/PSpicePrimer.pdf>, Updated Mar. 25, 2005.*

(Continued)

*Primary Examiner*—Tuan T Lam
*Assistant Examiner*—Daniel Rojas
(74) *Attorney, Agent, or Firm*—Ratner Prestia

(57) ABSTRACT

A transconductor and filter circuit is described. In one embodiment, a front end module within the transconductor and filter circuit converts a differential input voltage signal into a differential output current and supplies the output current at a differential output. A filter module coupled to the differential output of the front end module receives the differential output current, converts the output current into an intermediary differential voltage, and filters the differential voltage to obtain a filtered differential output voltage signal having low output impedance.

18 Claims, 8 Drawing Sheets

U.S. PATENT DOCUMENTS

| | | | |
|---|---|---|---|
| 6,677,822 | B2 | 1/2004 | Hasegawa |
| 2002/0011895 | A1 | 1/2002 | Kuo |
| 2002/0037706 | A1 | 3/2002 | Ichihara |
| 2002/0130713 | A1 | 9/2002 | Guimaraes |
| 2003/0038685 | A1* | 2/2003 | West ............... 331/185 |
| 2003/0052738 | A1 | 3/2003 | Tanaka |
| 2003/0080811 | A1 | 5/2003 | Nakatani |
| 2003/0107466 | A1 | 6/2003 | Hecht |
| 2003/0119462 | A1 | 6/2003 | Ben-Ayun |
| 2003/0184459 | A1 | 10/2003 | Engl |
| 2003/0186669 | A1 | 10/2003 | Yamawaki |
| 2003/0206042 | A1* | 11/2003 | Walker et al. ............ 327/156 |
| 2004/0017259 | A1 | 1/2004 | Cho et al. |
| 2004/0053590 | A1* | 3/2004 | Marholev ............... 455/213 |
| 2007/0057701 | A1* | 3/2007 | Abdeleatty Ali ............ 327/108 |

FOREIGN PATENT DOCUMENTS

| | | |
|---|---|---|
| EP | 0 580 482 A1 | 1/1994 |
| EP | 0 739 549 B1 | 11/1999 |
| EP | 1 128 547 A2 | 8/2001 |
| EP | 1 289 123 A1 | 3/2003 |
| EP | 1 300 944 A2 | 4/2003 |
| GB | 2 357 384 A | 6/2001 |
| KR | 2001003639 | 1/2001 |
| WO | WO 94/23494 | 10/1994 |
| WO | WO 01/24352 A1 | 4/2001 |
| WO | WO 01/24353 A1 | 4/2001 |

OTHER PUBLICATIONS

*Analysis of the Sallen-Key Architecture* (Application Report); Texas Instruments, 1999.

Gilbert, Barrie. The Multi-tanh Principle: A Tutorial Overview. IEEE Journal of Solid-State Circuits. vol. 33. No. 1. Jan. 1998.

Guo, C. et. al.; *A Fully Integrated, Low Noise and Low Power BiCMOS Front-end Readout System for Capacitive Detectors;* Kluwer Academic Publishers, The Netherlands, 2001.

Horrocks, D. et al.; *Component Value Selection for Active Filters Using Genetic Algorithms;* School of Electrical, Electronic and Systems Engineering, University of Wales, College of Cardiff, Great Britain.

Maxim QuickView Data Sheet (web page); *Max 7480 8th -Order, Lowpass, Butterworth, Switched-Capacitor Filter.*

McNeill, D. et. al.; *Analog Hardware Tolerance of Soft Competitive Learning;* Department of Electrical and Computer Engineering, University of Manitoba, Winnipeg, Canada.

Thomann, W. et at.; *Fully Integrated W-CDMA If Receiver and If Transmitter Including If Synthesizer and On-Chip VCO for UMTS Mobiles*; IEEE Journal of Solid-State Circuits (USA), vol. 36, No. 9, pp. 1407-1419, USA, Sep. 2001.

Di Benedetto, M. et al.; *Analysis of the Effect of the I/Q Base-Band Filter Mismatch in an OFDM Modern*; Wireless Personal Communications, vol. 12, No. 2, pp. 175-186; Kluwer Academic Publishers, USA, Feb. 2000.

Changyong, P. et. al.; *Novel Universal Demodulator for Remote Sensing Satellites*; Proceedings of the SPIE—The International Society for Optical Engineering Conference Title: Proc. SPIE—Int. Soc. Opt. Eng. (USA) vol. 3704, pp. 189-195; SPIE-Int. Soc. Opt. Eng. USA, 1999.

Lee, J.H. et. al.; *Design of a Modulator ASIC for Wide Band CDMA Wireless Local Loop System*; 1998 Midwest Symposium on Circuits and Systems (Cat. No. 98CB36268) p. 596-9; IEEE Comput. Soc, Los Alamitos, CA, USA, 1999.

Katsumi, C. et. al.; *A Single-Chip LSI for Low-Speed Modems*; Mitsubishi Denki Giho, vol. 56, No. 4, pp. 273-275, Japan, 1982.

* cited by examiner

TRANSCONDUCTOR AND FILTER CIRCUIT

TECHNICAL FIELD

The invention relates generally to the field of electronic circuits, and more particularly, to a transconductor and filter circuit.

BACKGROUND OF THE INVENTION

Numerous circuits are known, which are intended to provide conversion of a differential voltage input signal into an output current. These circuits have proven value in a variety of ever expanding communications applications. One example of such circuits is a triple differential amplifier that uses parallel- or series-connected sets of differential pairs of bipolar transistors whose inputs and outputs are connected in parallel, as described in detail in "The Multi-tanh Principle: A Tutorial Overview," by Barrie Gilbert, published in the IEEE Journal of Solid-State Circuits, Vol. 33, No. 1, January 1998, and incorporated by reference herein.

Since the output impedance of such circuits is typically high, solutions have been proposed to lower the output impedance by, for example, buffering the output of the circuit with a pair of emitter followers. However, these solutions do not appear to offer low pass filtering capabilities within the circuit without an increase in power consumption. Thus, there is a need for a circuit that lowers the output impedance and merges the low pass filtering function in the circuit, without adding significant complexity or power consumption.

SUMMARY OF THE INVENTION

A transconductor and filter circuit is described. In one embodiment, a front end module within the transconductor and filter circuit converts a differential input voltage signal into a differential output current and supplies the output current at a differential output. A filter module coupled to the differential output of the front end module receives the differential output current, converts the output current into an intermediary differential voltage, and filters the differential voltage to obtain a filtered differential output voltage signal having low output impedance.

DETAILED DESCRIPTION

Figure 1:
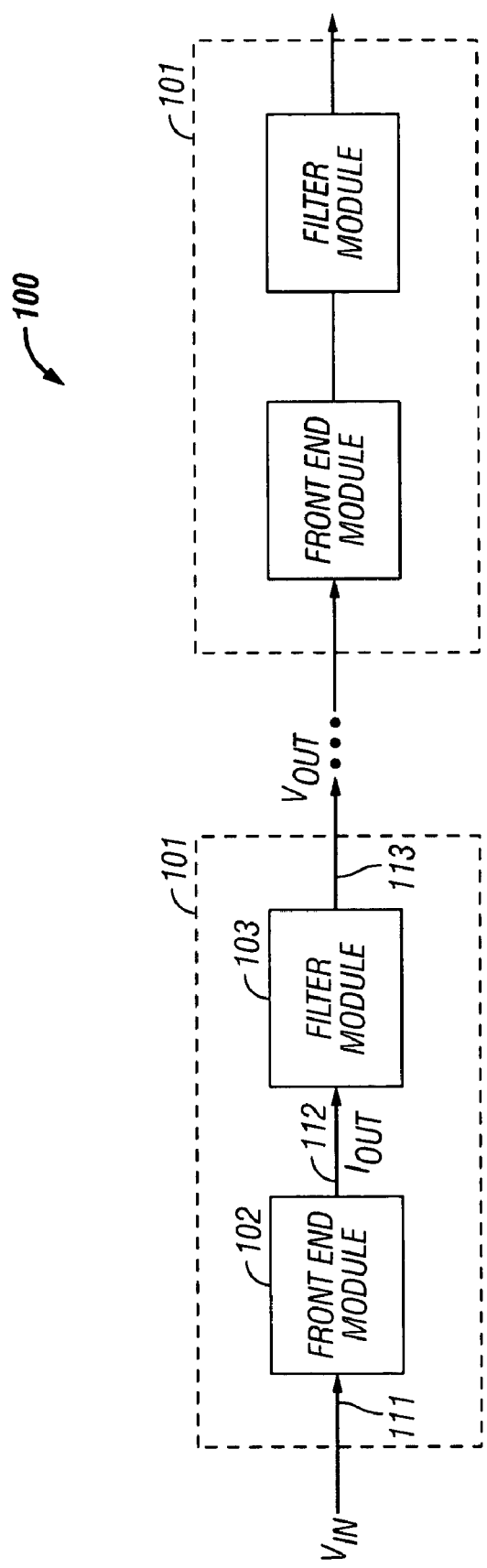
FIG. 1 is a block diagram illustrating a multistage transconductor and filter circuit according to an exemplary embodiment of the invention.

FIG. 1 is a block diagram illustrating a multistage transconductor and filter circuit according to an exemplary embodiment of the invention. As illustrated in FIG. 1, the multistage transconductor and filter circuit 100 includes multiple similar stages 101. In one embodiment, each stage 101 is a transconductor and filter circuit, which includes a front end module 102 coupled to a filter module 103, as described in further detail below. In an alternate embodiment, the front end module 102 and the filter module 103 may be implemented on separate circuits.

The front end module 102 receives a differential input voltage signal ($V_{IN}$) 111 and converts the differential input voltage signal 111 into a differential output current ($I_{OUT}$) 112. The filter module 103 receives the differential output current 112 and outputs a differential output voltage signal ($V_{OUT}$) 113, which is further supplied to a subsequent stage 101 within the multistage transconductor and filter circuit 100.

Figure 2:
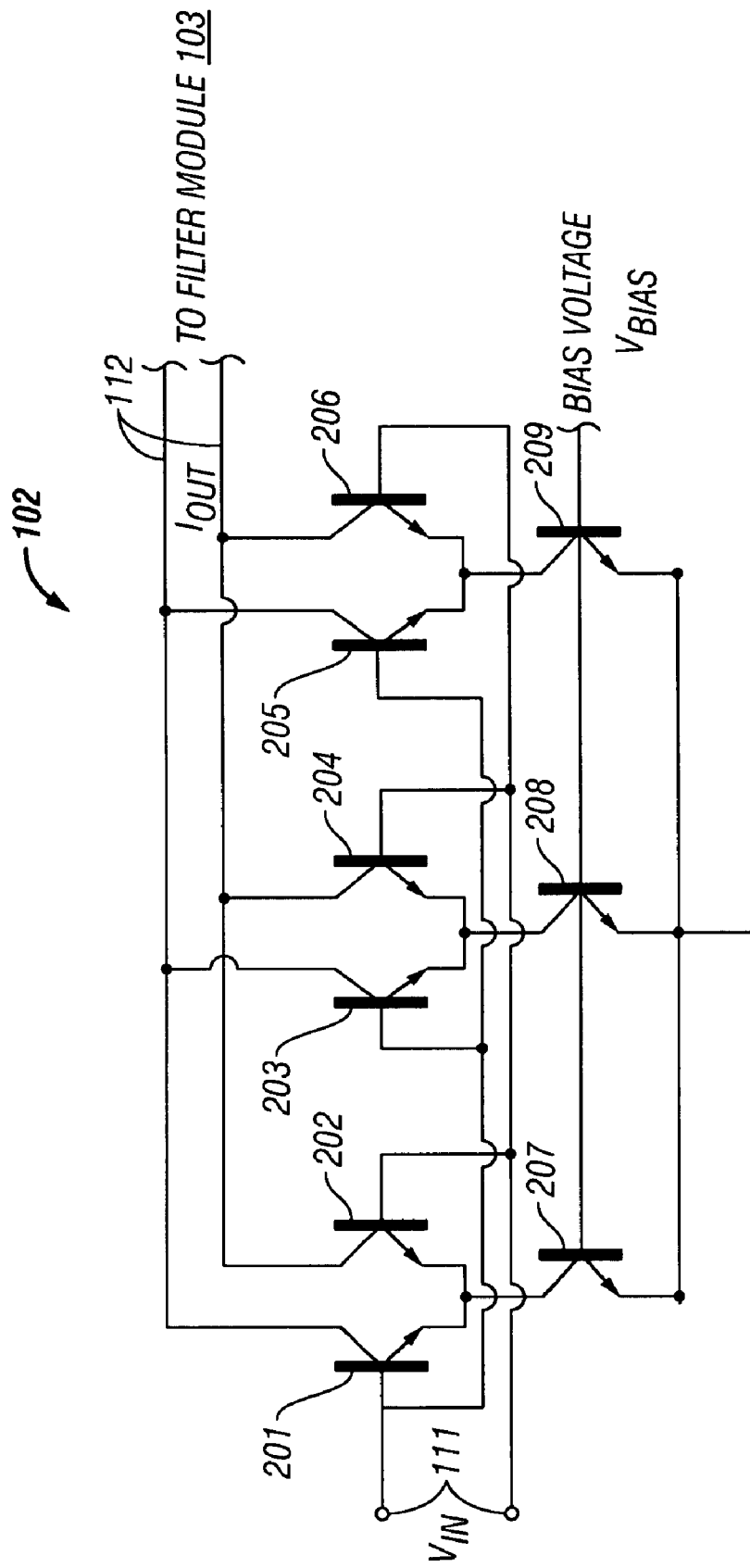
FIG. 2 is a circuit diagram illustrating an exemplary prior art front end module within one stage of the multistage transconductor and filter circuit.

FIG. 2 is a circuit diagram illustrating an exemplary prior art front end module within one stage of the multistage transconductor and filter circuit. As illustrated in FIG. 2, the front end module 102 is a differential amplifier, such as, for example, a triple differential amplifier or "triplet" circuit, as described in further detail in "The Multi-tanh Principle: A Tutorial Overview," by Barrie Gilbert, published in the IEEE Journal of Solid-State Circuits, Vol. 33, No. 1, January 1998, and incorporated by reference herein.

The front end module 102 includes one or more differential transistor pairs configured to convert $V_{IN}$ 111 into $I_{OUT}$ 112. The front end module 102 shown in FIG. 2 includes three differential pairs of transistors 201-202, 203-204, and 205-206, having inputs and outputs coupled in parallel. The emitters of each differential transistor pair 201-202, 203-204, 205-206 are coupled to corresponding collectors of transistors 207, 208, 209. The bases of transistors 207, 208, 209 are coupled to receive a bias voltage $V_{BIAS}$. In one embodiment, the outer differential pairs 201-202 and 205-206 have opposing emitter-area ratios of A and operate at equal tail currents. The center differential pair 203-204 has equal emitter areas, such that a transconductance value $g_M$ of the circuit 102 is centered at $V_{IN}=0$. The emitter bias current transmitted to this center pair 203-204 is set to K times the emitter bias current transmitted to the outer pairs, where K is a factor less than 1. For different values of A and K and in order to minimize distortion, the incremental transconductance $g_M$ for the circuit 102 can be maintained at a nearly constant value over a wide range of the differential input voltage signal $V_{IN}$ 111. The $g_M$ value for $V_{IN}=0$ can be determined as follows:

$$g_M = g_{M0} \times \frac{1}{2+K} \times \left\{ \frac{8A}{(1+A)^2} + K \right\}$$

where $g_{M0}$ is the $g_M$ that would result with A=1, that is using the total tail current in a single differential transistor pair. $g_{M0}$ can be calculated as follows:

$$g_{M0} = \frac{qI_C}{kT}$$

where q is the election charge, $I_C$ is the total current, k is the Boltzmann constant, and T is the temperature in Kelvins (K).

Figure 3:
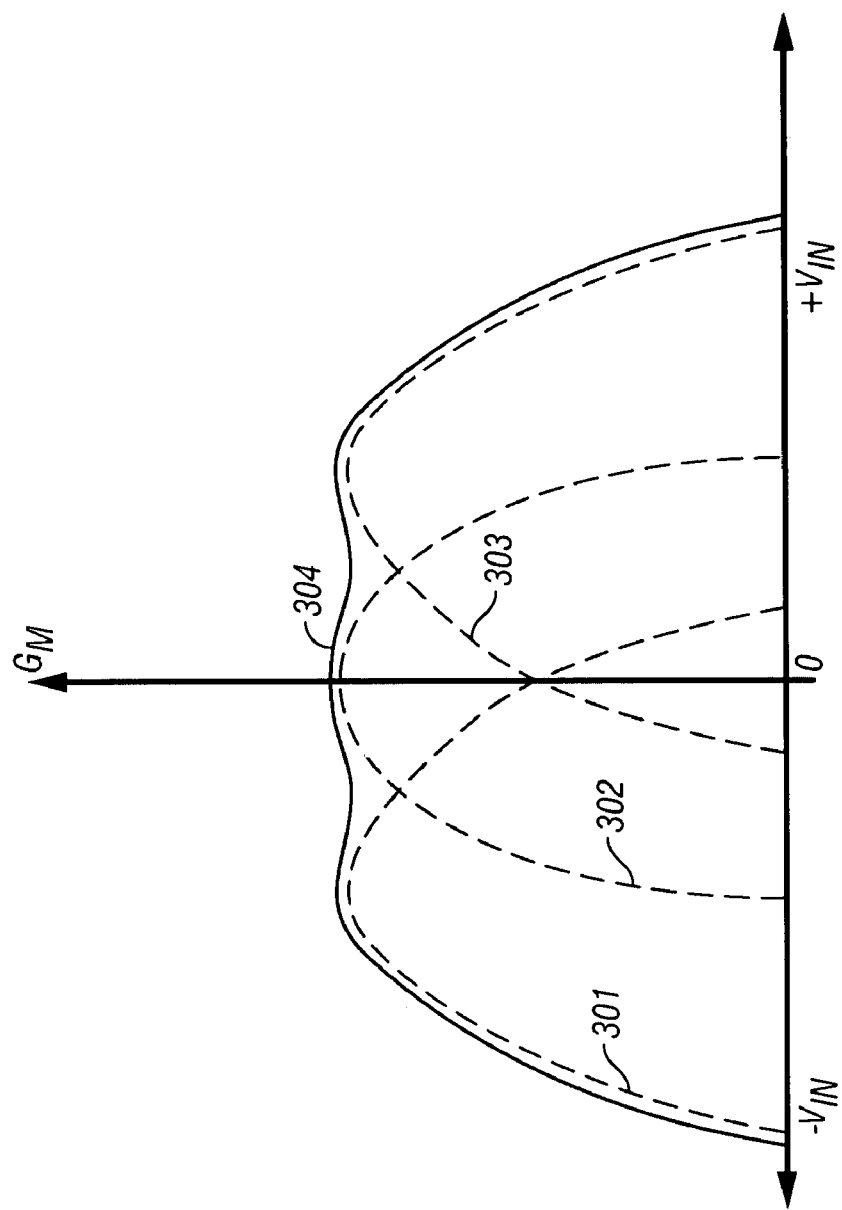
FIG. 3 is a graph illustrating the effective transconductance as a function of the differential input voltage for the prior art front end module.

FIG. 3 is a graph illustrating the effective transconductance $g_M$ as a function of the differential input voltage $V_{IN}$ 111 for the prior art front end module 102. As illustrated in FIG. 3, the graphic representations 301, 302, and 303 correspond to the differential transistor pairs 201-202, 203-204, and 205-206, respectively, and are offset due to the performance of each respective differential transistor pair. A composite graphic representation 304 illustrates the transconductance $g_M$ of the front end module 102 as a function of the differential input voltage $V_{IN}$ 111.

Figure 4:
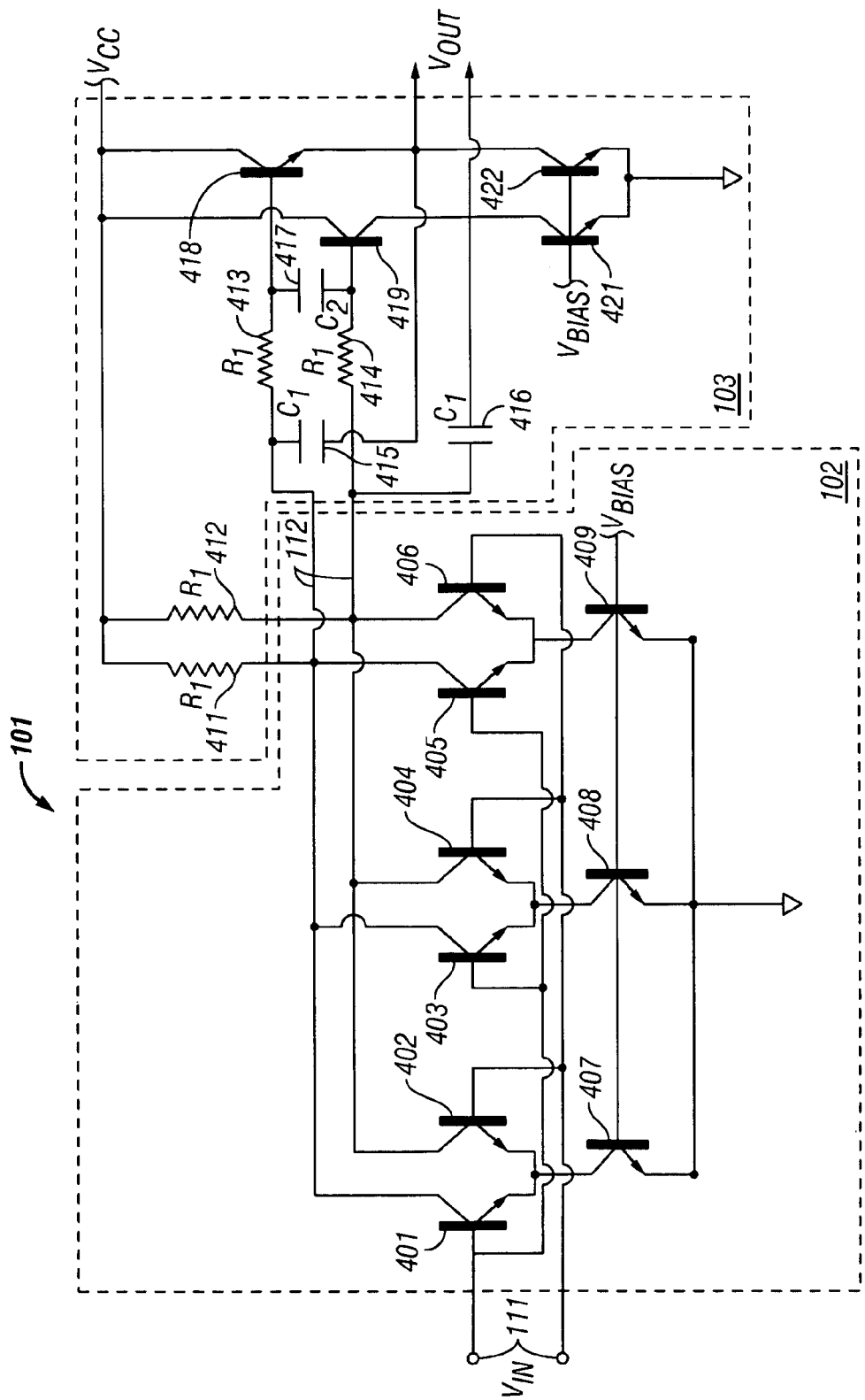
FIG. 4 is a circuit diagram illustrating a transconductor and filter circuit according to an exemplary embodiment of the invention.

FIG. 4 is a circuit diagram illustrating a transconductor and filter circuit 101 according to an exemplary embodiment of the invention. As illustrated in FIG. 4, in one embodiment, the transconductor and filter circuit 101 includes a front end module 102 similar to the front end module described in detail in connection with FIG. 2, having three differential pairs of transistor devices 401-402, 403-404, and 405-406, having inputs and outputs coupled in parallel. Alternatively, the circuit 101 may include any number of differential transistor pairs. The emitters of each differential transistor pair 401-402, 403-404, 405-406 are coupled to corresponding collectors of transistor devices 407, 408, 409. The bases of transistor devices 407, 408, 409 are coupled to receive a bias voltage $V_{BIAS}$.

In one embodiment, the differential output current 112 is supplied to the filter module 103 at the output of the front end module 102. The filter module 103 includes resistor devices ($R_1$) 411, 412, 413 and 414. Each resistor device 411, 412 is coupled from $V_{CC}$ to each output current 112. This arrangement converts the differential output current 112 into an intermediary differential voltage. Each resistor device 413, 414 is coupled in series to one line of the differential output of the front end module 102. In one embodiment, the resistor devices 411, 412, 413 and 414 have an identical resistance value $R_1$. The filter module 103 further includes capacitor devices 415 and 416 coupled to the corresponding resistor devices 413 and 414. A further capacitor device 417 is coupled between the two resistor devices 413 and 414. In one embodiment, the capacitor devices 415 and 416 have an identical capacitance value $C_1$ and the capacitor device 417 has a capacitance value $C_2$. In an alternate embodiment, the resistor devices 413, 414 and the capacitor devices 415, 416, and 417 may be implemented on a separate circuit coupled to the front end module 102.

The differential voltage is further supplied to a pair of emitter followers 418, 419. The voltage gain of the emitter followers 418, 419 has a value of less than 1 and provides a low output impedance to drive a subsequent stage 101. The base of each transistor device 418, 419 is coupled to a respective resistor device 413, 414. The emitter of each transistor device 418, 419 is coupled to a corresponding collector of transistor devices 421, 422, which have their bases coupled to receive a bias voltage $V_{BIAS}$.

In one embodiment, the transfer function of the circuit 101 is calculated as follows:

$$T(S) = \left[ \frac{g_M}{\frac{S^2}{\omega_0^2} + \frac{aS}{\omega_0^2} + 1} \right] \times R_1$$

where $g_M$ is the effective transconductance of the circuit 101; $\omega_0$ is the corner frequency of the filter module 103; a is a coefficient determined by the selection of the resistance $R_1$, and of the capacitances $C_1$, and $C_2$; and $g_M R_1$ is the effective gain of the circuit 101. The low pass filter function can thus be implemented with a voltage gain of $g_M R_1$.

Figure 5:
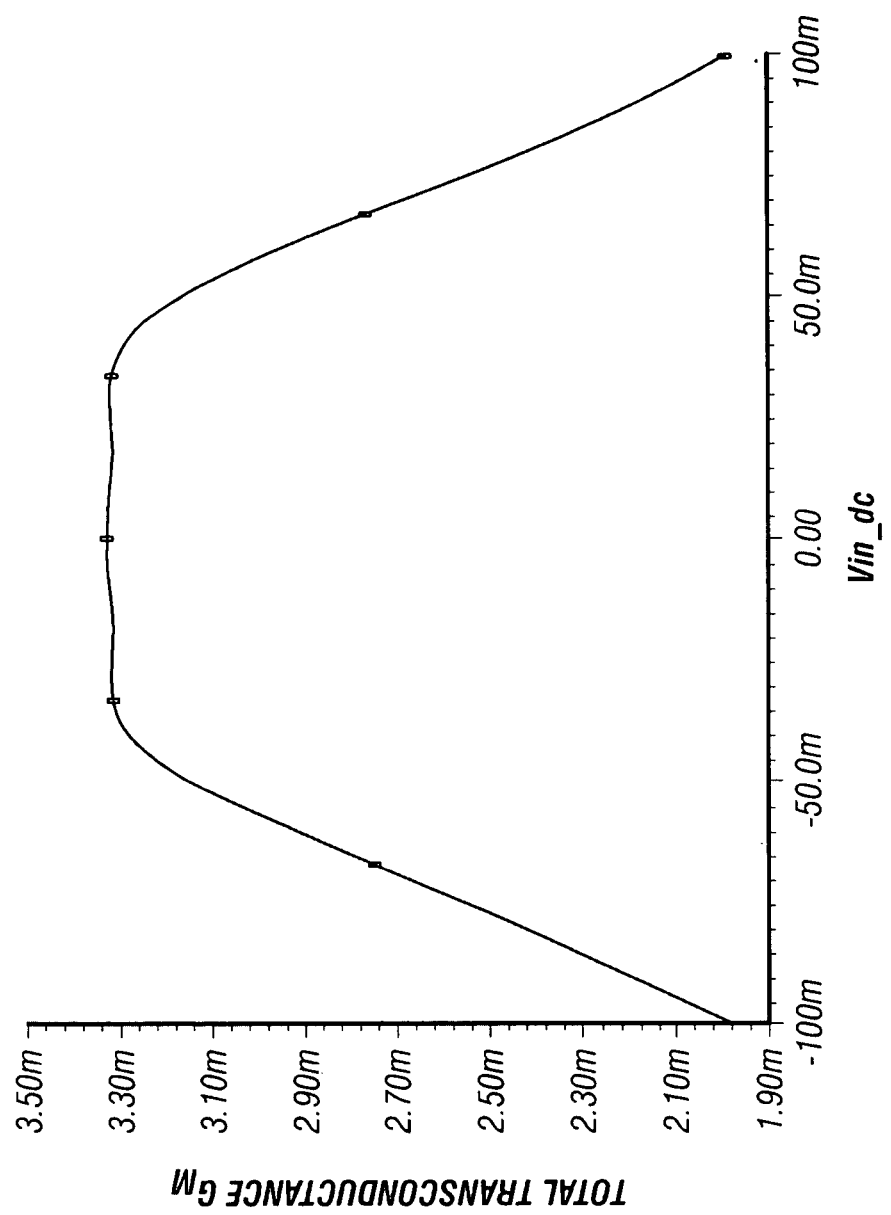
FIG. 5 is a graph illustrating the total transconductance for the transconductor and filter circuit according to an exemplary embodiment of the invention.

FIG. 5 is a graph illustrating the total transconductance for the transconductor and filter circuit 101 according to an exemplary embodiment of the invention. As shown in FIG. 5, the total transconductance $g_M$, as a function of the differential input voltage $V_{IN}$ 111, is a composite of the transconductance values for the corresponding differential transistor pairs 401-402, 403-404, 405-406, which are displaced in center voltage. By broadening the transconductance over the differential input voltage $V_{IN}$ 111, the circuit 101 has a broader signal handling range before it becomes non-linear.

Figure 6:
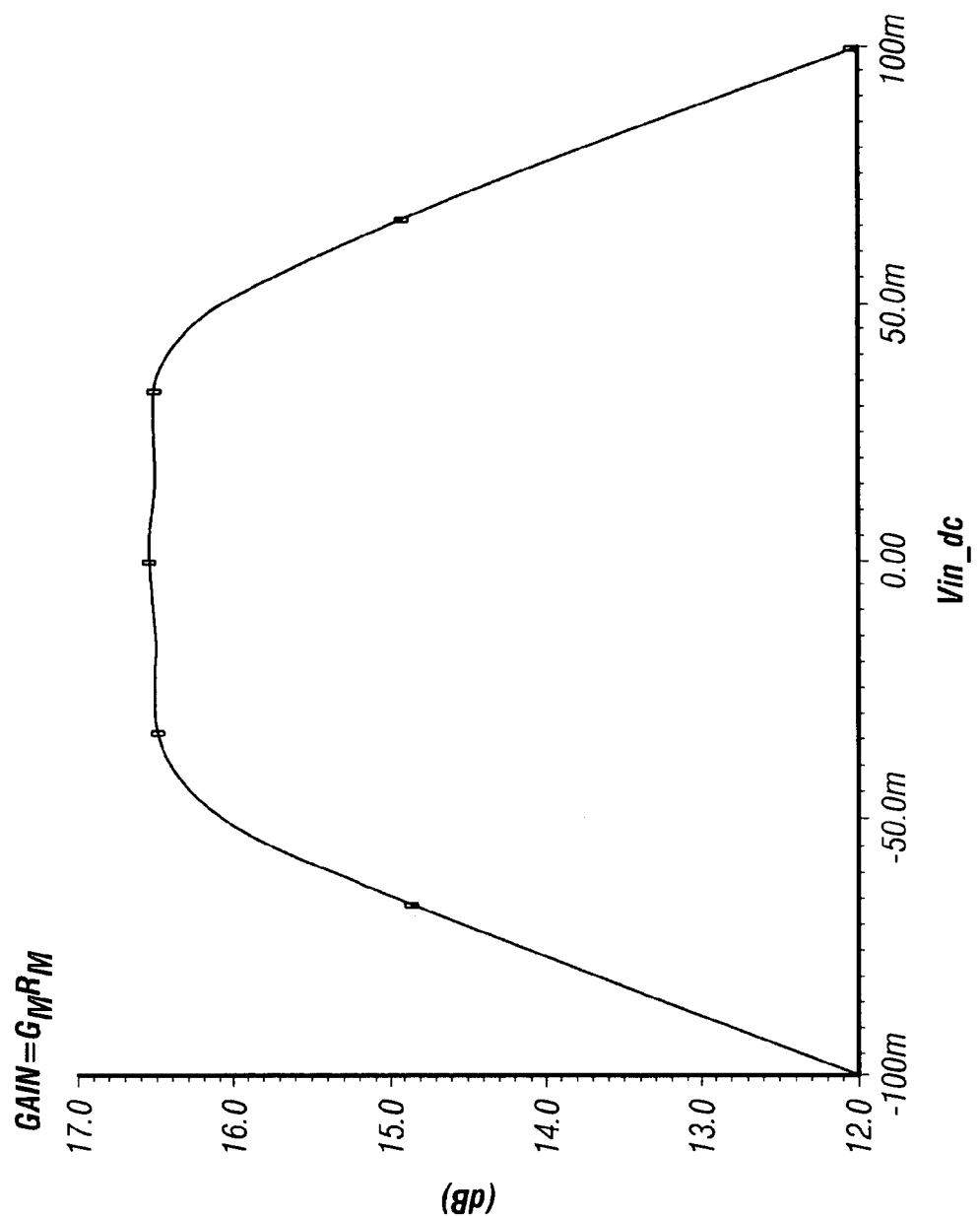
FIG. 6 is a graph illustrating the effective gain for the transconductor and filter circuit according to an exemplary embodiment of the invention.

FIG. 6 is a graph illustrating the effective gain for the transconductor and filter circuit 101 according to an exemplary embodiment of the invention. In one embodiment, the effective gain of the circuit 101, which is defined as the differential voltage across the two resistors 411 and 412 divided by the differential input voltage 111, is a function of the transconductance $g_M$ times the value $R_1$ of the resistors 411, 412.

Figure 7:
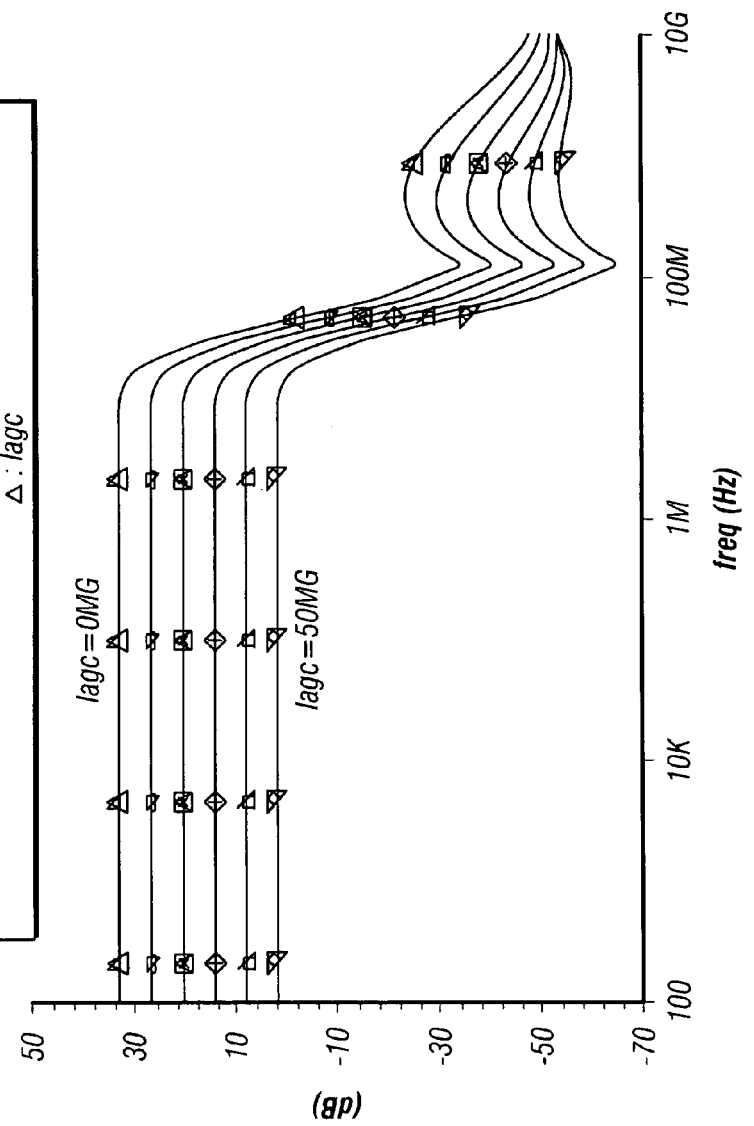
FIG. 7 is a graph illustrating the voltage gain of a fourth order Butterworth filter for various values of a control current $I_{AGC}$ according to an exemplary embodiment of the invention.

FIG. 7 is a graph illustrating the voltage gain of a fourth order Butterworth filter for various values of a control current $I_{AGC}$ according to an exemplary embodiment of the invention. As shown in FIG. 7, in one embodiment, the voltage gain, in decibels (dB), varies for a control current $I_{AGC}$ between 0 and 50 microAmpers (μA). However, the filter characteristics remain unchanged and are independent of the voltage gain.

In one embodiment, a fourth order Butterworth filter is implemented with two transconductor and filter circuits 101 cascaded together, as shown in the multistage circuit 100 of FIG. 1. The two transconductor and filter circuits 101 are not identical, having different values for the capacitance of capacitors 415, 416, and 417. In an alternate embodiment, a Bessel filter may be implemented using the transconductor and filter circuit 101. In another alternate embodiment, an approximation of a Gaussian filter may be implemented using the transconductor and filter circuit 101. In yet another alternate embodiment, a transitional filter may be implemented using the transconductor and filter circuit 101. The transfer function of the fourth order Butterworth filter can be calculated according to the following equation:

$$T(S) = \frac{1}{S^4 + cS^3 + dS^2 + cS + 1}$$

For c=2.61, d=3.41, and if S=jω=j, then:

$$T(S) = \frac{1}{j^4 + cj^3 + dj^2 + cj + 1} = \frac{1}{1 - jc - d + jc + 1} = \frac{1}{2 - d} = \frac{1}{\sqrt{2}}$$

Further breaking the $4^{th}$ order in to two $2^{nd}$ order equations:

$$\frac{1}{S^2 + aS + 1} \times \frac{1}{S^2 + bS + 1} = \frac{1}{S^4 + cS^3 + dS^2 + cS + 1}$$

Thus equating like terms in powers of S, $$a + b = c \text{ and } 2 + ab = d$$

$$b = \frac{d-2}{a}$$

$$a + \frac{d-2}{a} = c$$

$$a^2 - ca + d - 2 = 0$$

$$a = \frac{c \pm \sqrt{c^2 - 4(d-2)}}{2}$$

$$= \frac{2.61 \pm \sqrt{(2.61)^2 - 4(3.41 - 2)}}{2}$$

$$= 1.843 \text{ or } 0.7674$$

$$b = c - a = 0.7674 \text{ or } 1.843$$

Note: 0.7674 is the high Q case and 1.843 is the low Q case. A $2^{nd}$ order general Sallen-Key type low pass filter has the transfer function: (see Fig x):

$$T(S) = k \frac{1}{S^2 R_1 R_2 C_1 C_2 + S((1-k)R_1 C_1 + R_2 C_2 + R_1 C_2) + 1}$$

Where R1, R2, C1 & C2 are component values and k is the amplifier voltage gain. Normalizing to $$j\omega_0 = j \text{ and } R_1 R_2 C_1 C_2 = \frac{1}{\omega_0^2} = 1, \text{ let } R_1 = R_2 = R$$

$$R[(1-k)C_1 + 2C_2] = 1.843 \text{ (or } 0.7674\text{)}$$

$$R^2 C_1 C_2 = 1$$

Further normalize to R=1

$$[(1-k)C_1 + 2C_2] = 1.843 \text{ if } C_1 C_2 = 1$$

$$(1-k)C_1 + \frac{2}{C_1} = 1.843$$

$$(1-k)C_1^2 - 1.843 C_1 + 2 = 0$$

$$C_1 = \frac{\frac{1.843}{(1-k)} \pm \sqrt{\left(\frac{1.843}{1-k}\right)^2 - 4\left(\frac{2}{1-k}\right)}}{2}$$

$$\left(\frac{1.843}{1-k}\right)^2 \geq \frac{8}{1-k}$$

$$1.843^2 \geq 8(1-k)$$

Thus, $k \geq 0.5754$. If the coefficient S is 0.7674, then $k \geq 0.9264$.

If the assumption is that $k \cong 0.95$ (emitter follower gain) and for S=1.843, then:

$$C_1 = \frac{\frac{1.843}{(1-0.95)} \pm \sqrt{\left(\frac{1.843}{1-0.95}\right)^2 - 4\left(\frac{2}{1-0.95}\right)}}{2}$$

$$= 1.119 \text{ (normalized low } Q\text{)}$$

$$C_2 = \frac{1}{C_1}$$

$$= 0.8935 \text{ (normalized low } Q\text{)}$$

If the assumption is that $k \cong 0.95$ and for S=0.7674, then:

$$C_1 = \frac{\frac{0.7674}{(1-0.95)} \pm \sqrt{\left(\frac{0.7674}{1-0.95}\right)^2 - 4\left(\frac{2}{1-0.95}\right)}}{2}$$

$$= 3.328 \text{ (normalized high } Q\text{)}$$

$$C_2 = \frac{1}{C_1}$$

$$= 0.3005 \text{ (normalized high } Q\text{)}$$

Let R=2,000 (circuit value) and desired corner frequency $\omega_0 = 2\pi(15 \text{ MHz})$.

For $k \geq 0.5754$:

$$C_1' = \frac{C_1}{R\omega_0}$$

$$= 5.936 \text{ pF (circuit value)}$$

$$C_2' = \frac{C_2}{R\omega_0}$$

$$= 4.74 \text{ pF (circuit value)}$$

For $k \geq 0.9264$:

$$C_1' = \frac{C_1}{R\omega_0}$$

$$= 17.66 \text{ pF (circuit value)}$$

$$C_2' = \frac{C_2}{R\omega_0}$$

$$= 1.594 \text{ pF (circuit value)}$$

$$T(S) = \frac{1}{S^2 + aS + 1} \qquad |T(S)|_{S=j\omega_0=j} = \left|\frac{1}{ja}\right|$$

$$= \frac{1}{a}$$

$$= 0.5426$$

$$= -5.31 \text{ dB (low } Q \text{ case)}$$

$$T(S) = \frac{1}{S^2 + bS + 1} \qquad |T(S)|_{S=j\omega_0=j} = \left|\frac{1}{jb}\right|$$

$$= \frac{1}{b}$$

$$= 1.303$$

$$= +2.3 \text{ dB (high } Q \text{ case)}$$

Note that the product of the above T(S) sections yields −3.01 dB, the requisite 3 dB corner frequency.

The values of R, $C_1'$ and $C_2'$ are the values used in Figure x with two cascaded sections. These values directly map into the differential circuit of FIG. 4 with the exception of $C_2'$ which maps into FIG. 4 with a scale factor of ½ due to the differential nature of FIG. 4.

Figure 8:
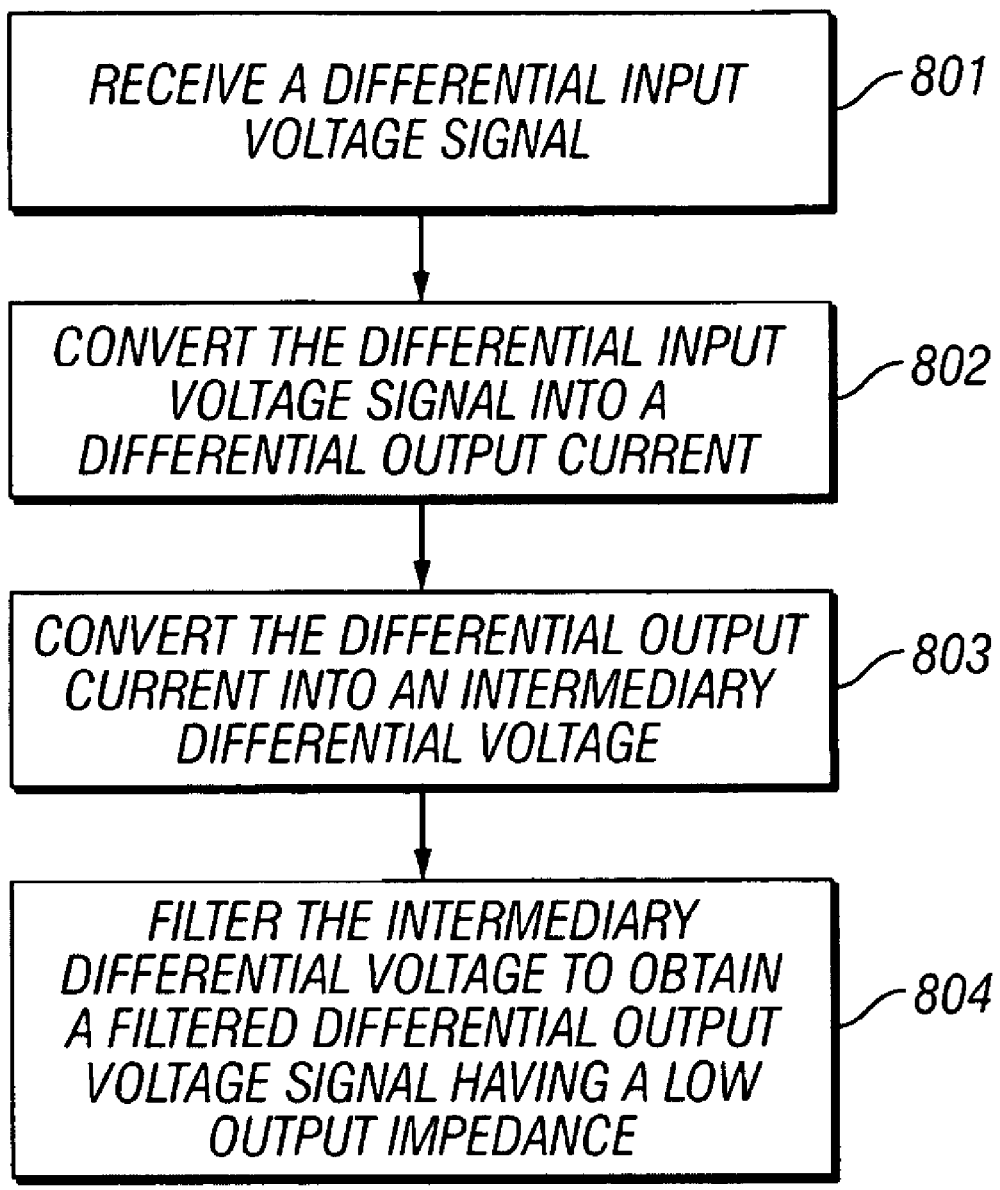
FIG. 8 is a flow diagram illustrating a method for low pass filtering within the transconductor and filter circuit according to an exemplary embodiment of the invention.

FIG. 8 is a flow diagram illustrating a method for low pass filtering within the transconductor and filter circuit according to an exemplary embodiment of the invention. As shown in FIG. 8, at processing block 801, a differential input voltage signal is received. At processing block 802, the differential input voltage signal is converted into a differential output current. At processing block 803, the differential output current is converted into an intermediary differential voltage. Finally, at processing block 804, the intermediary differential voltage is filtered to obtain a filtered differential output voltage signal having low output impedance.

It is also to be understood that embodiments of the present invention may be implemented not only within a physical circuit (e.g. on a semiconductor chip), but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL), Verilog language, or Spice language. Some netlist examples include: a behavioral level netlist, a register transfer level (RTL) netlist, a gate level netlist, and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of a processing core (such as the CPU of a computer) or otherwise implemented or realized upon or within a machine-readable medium, which includes any mechanism for storing or transmitting information in a form readable by a machine (e.g. a computer).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A circuit comprising:
a front end module for converting a differential input voltage signal into a differential output current and supplying said output current at a differential output; and
a filter module coupled to said differential output of said front end module for receiving said output current, converting said output current into a differential voltage and filtering said differential voltage to obtain a filtered differential output voltage signal,
wherein said filter module further comprises:
a plurality of resistor devices, a first end of each resistor device directly coupled in series to a respective line of said differential output of said front end module,
a plurality of emitter followers, a base of each emitter follower directly coupled to a second end of each of said resistor devices,
a plurality of capacitor devices, a first end of each capacitor device directly coupled to a respective line of said differential output of said front end module and a second end of each capacitor device directly coupled to a respective emitter of said emitter followers,
a further capacitor device coupled between each base of the emitter followers.

2. The circuit according to claim 1, wherein said filter module is a low pass filter.

3. The circuit according to claim 1, wherein said front end module further comprises at least one differential pair of transistor devices having inputs and outputs coupled in parallel.

4. The circuit according to claim 1, wherein a voltage gain value of said circuit is less than unity.

5. The circuit according to claim 1, wherein said emitter follower has a voltage gain value of less than unity.

6. The circuit according to claim 1, wherein each resistor device of said plurality of resistor devices has an identical resistance value.

7. The circuit according to claim 1, wherein said each capacitor device has an identical capacitance value.

8. The circuit according to claim 1, wherein said resistor devices, said capacitor devices, and said further capacitor device are implemented on a separate circuit.

9. A method to manufacture a circuit comprising the steps of:
coupling a filter module to a differential output of a front end module;
said front end module for converting a differential input voltage signal into a differential output current and supplying said output current at said differential output; and
said filter module for receiving said output current, converting said output current into a differential voltage, and filtering said differential voltage to obtain a filtered differential output voltage signal;
wherein said step of coupling said filter module further comprises the steps of:
coupling in series a plurality of resistor devices to said differential output of said front end module, a first end of each resistor device coupled to a respective line of said differential output,
coupling an emitter follower to a second end of each of said resistor devices,
coupling a plurality of capacitor devices between (a) said differential output of said front end module, each capacitor device coupled to one line of said differential output and (b) said emitter followers, each capacitor device coupled to an emitter of each of said emitter followers, and
coupling a further capacitor device between respective bases of said emitter followers.

10. The method according to claim 9, further comprising the step of:
coupling in parallel inputs and outputs of at least one differential pair of transistor devices within said front end module, said at least one differential pair of transistor devices to receive and convert said differential input voltage signal into said output current.

11. The method according to claim 9, wherein said filter module is a low pass filter.

12. The method according to claim 9, wherein said emitter follower has a voltage gain value of less than unity.

13. A method comprising the steps of:
converting a differential input voltage signal into a differential output current;
converting said output current into a differential voltage output; and
filtering said differential voltage output to obtain a filtered differential output voltage signal;
wherein said step of filtering further comprises the steps of:

coupling in series a plurality of resistor devices to said differential voltage output, a first end of each resistor device coupled to a respective line of said differential voltage output, coupling an emitter follower to a second end of each of said resistor devices, coupling a plurality of capacitor devices between (a) said differential voltage output of said front end module, each capacitor device coupled to one line of said differential voltage output, and (b) said emitter followers, each capacitor device coupled to an emitter of each of said emitter followers, and coupling a further capacitor device between respective bases of said emitter followers.

14. The method according to claim 13, wherein said step of converting said differential input voltage signal further comprises the steps of:

receiving said differential output voltage signal at a front end module; and supplying said differential output current at a differential output of said front end module.

15. The method according to claim 14, wherein said step of converting said output current further comprises the steps of:

receiving said output current at a filter module coupled to said differential output of said front end module.

16. A circuit comprising:

means for converting a differential input voltage signal into a differential output current;

means for converting said output current into a differential voltage; and means for filtering said differential voltage to obtain a filtered differential output voltage signal;

wherein said filter means further comprises:

a plurality of resistor devices, a first end of each resistor device directly coupled in series to a respective line providing said differential voltage, a plurality of emitter followers, a base of each emitter follower directly coupled to a second end of each of said resistor devices, a plurality of capacitor devices, a first end of each capacitor device directly coupled to a respective line providing said differential voltage and a second end of each capacitor device directly coupled to a respective emitter of said emitter followers, a further capacitor device coupled between each base of the emitter followers.

17. The method according to claim 13, wherein said filtered differential output voltage signal is transmitted to a subsequent stage of another front end module.

18. A machine-readable media storing a description of a circuit and containing executable instructions, which, when executed, causes a machine to emulate said circuit to perform a method comprising the steps of:

converting a differential input voltage signal into a differential output current;

converting said output current into a differential voltage; and filtering said differential voltage to obtain a filtered differential output voltage signal;

wherein said step of filtering further comprises the steps of:

coupling in series a plurality of resistor devices to said differential voltage, a first end of each resistor device coupled to a respective line providing said differential voltage, coupling an emitter follower to a second end of each of said resistor devices, coupling a plurality of capacitor devices between (a) said differential voltage, each capacitor device coupled to a respective line providing said differential voltage, and (b) said emitter followers, each capacitor device coupled to an emitter of each of said emitter followers, and coupling a further capacitor device between respective bases of said emitter followers.

* * * * *